(12) United States Patent
Tarutani et al.

(10) Patent No.: US 7,095,227 B2
(45) Date of Patent: Aug. 22, 2006

(54) SUPERCONDUCTING DRIVER CIRCUIT

(75) Inventors: Yoshinobu Tarutani, Tokyo (JP);
Masahiro Horibe, Tukuba (JP); Keiichi Tanabe, Mito (JP)

(73) Assignee: International Superconductivity Technology Center, the Juridical Foundation, Tokyo (JP)

( * ) Notice: Subject to any disclaimer, the term of this patent is extended or adjusted under 35 U.S.C. 154(b) by 0 days.

(21) Appl. No.: 10/519,719

(22) PCT Filed: Aug. 5, 2003

(86) PCT No.: PCT/JP03/09950

§ 371 (c)(1),
(2), (4) Date: Dec. 30, 2004

(87) PCT Pub. No.: WO2004/013965

PCT Pub. Date: Feb. 12, 2004

(65) Prior Publication Data
US 2005/0231196 A1 Oct. 20, 2005

(30) Foreign Application Priority Data
Aug. 5, 2002 (JP) .............................. 2002-227149

(51) Int. Cl.
*G01R 33/02* (2006.01)

(52) U.S. Cl. .................. 324/248; 505/846; 327/527

(58) Field of Classification Search ................ 324/248; 333/99 S; 330/124 R, 54; 505/845, 846, 505/705, 202, 193; 327/186, 367, 527
See application file for complete search history.

(56) References Cited

U.S. PATENT DOCUMENTS

| | | | | |
|---|---|---|---|---|
| 4,983,971 A | * | 1/1991 | Przybysz et al. | 341/133 |
| 6,486,756 B1 | * | 11/2002 | Tarutani et al. | 333/99 S |
| 6,580,310 B1 | * | 6/2003 | Herr | 327/528 |

FOREIGN PATENT DOCUMENTS

| | | |
|---|---|---|
| JP | 2000-261307 | 9/2000 |
| JP | 2001-068995 | 3/2001 |

OTHER PUBLICATIONS

H. Suzuki et al, "Applications of Synchronized Switching In Series-Parallel-Connected Josephson Junctions", IEEE Transactions on Electron Devices, vol. 37, p. 2399, 1990 *cited in the specification on pge 4 and the search report of the PCT procedure.
O.A. Mukhanov et al. "Josephson Output Interfaces for RSFQ Circuits", IEEE Transactions on Applied Superconductively, vol. 7, p. 2826, 1997 cited In the specification on p. 2.

* cited by examiner

*Primary Examiner*—Jay Patidar
(74) *Attorney, Agent, or Firm*—Antonelli, Terry, Stout and Kraus, LLP.

(57) ABSTRACT

To obtain a superconducting driver circuit which can obtain an output voltage of several millvolts or above, can use a DC power source as a driving power source, can form no capacitance between it and a ground plane, and has a small occupation area, the superconducting driver circuit is constructed by superconducting flux quantum interference devices (SQUIDs) each constructing a closed loop having as components two superconducting junctions and an inductor. The SQUIDs share the inductors and are connected in series in three or more stages.

10 Claims, 15 Drawing Sheets

SUPERCONDUCTING DRIVER CIRCUIT

BACKGROUND OF THE INVENTION

The present invention relates to the superconducting electronics field. More specifically, the present invention relates to a superconducting driver circuit of a superconducting flux quantum circuit which uses a flux quantum permitting high-speed signal processing as the carrier of a signal and is used for a measuring circuit for high-speed signal observation, an analog-to-digital signal converter circuit for high-speed analog signal processing, or a high-speed digital data processing circuit.

Two types of prior art driver circuits which are used for the output part of a superconducting flux quantum circuit and have a signal voltage amplifying function are considered and are used in a superconducting circuit. The prior art and embodiments will be described below with reference to the drawings. Only when discriminating between the parts indicated by the reference numerals, numerical subscripts will be identified as needed.

FIG. 2 is a diagram showing a constructional example of a squid type superconducting driver circuit with a control line which has been used. Superconducting flux quantum interference devices each having a closed loop by superconducting junctions 1 and an inductor 7, that is, SQUIDs 6 are connected in series and have a control line 21. A signal line inputting a signal 22 from a superconducting flux quantum circuit is connected to the control line 21 of the SQUIDs connected in series. The numeral 3 denotes a bias current source; the numeral 5 denotes an output line; and the numeral 8 denotes a ground.

There are two control line wiring methods. In one of the methods, one superconducting line is wired to SQUIDs in series as the control line of all the SQUIDs. In the other method, one signal line is branched to wire control lines to SQUIDs in parallel. When connecting the control lines in parallel, a signal is inputted to the SQUIDs at the same time, thereby enhancing the frequency characteristic.

The flux quantum signal 22 from the superconducting flux quantum circuit is inputted as a current signal to the control line 21. The output voltages of the SQUIDs 6 are changed by the current signal. A change in output voltage per SQUID is a small value of about 0.1 mV. To increase a change in voltage, ten or more squids are connected in series ("Josephson Output Interfaces for RSFQ Circuits" O. A. Mukhanov et al., IEEE Transactions on Applied Superconductivity, vol. 7, p. 2826, 1997).

FIG. 3 is a diagram showing another constructional example of a superconducting driver circuit using superconducting junction lines which has been used. One end of a superconducting junction line $100_1$ and one end of a superconducting junction line $100_2$ connecting superconducting junctions 1 in series are connected in parallel via resistances 31 and an inductor 9. An AC power source 32 supplies an AC voltage to the midpoint of the inductor 9. An output signal 5 is fetched from the midpoint of the inductor 9. The other end of the superconducting junction line $100_1$ and the other end of the superconducting junction line $100_2$ are grounded. The first stage of the superconducting junction line $100_1$ is connected to an input line to input a flux quantum signal 22. In the superconducting driver circuit, a superconducting junction exhibiting the hysteresis characteristic in the current-voltage characteristic is used.

The signal current pulse 22 from a superconducting flux quantum circuit is injected into a superconducting junction $1_1$ in the first stage of the superconducting junction line $100_1$. When an electric current of the signal current pulse 22 and a bias current of the AC power source 32 exceed a critical current, the superconducting junction $1_1$ is switched from the superconducting state to the voltage state. The resistance value of the superconducting junction in the voltage state is relatively high. The bias current selectively flows to the superconducting junction line $100_2$. The current values of the superconducting junctions 1 constructing the superconducting junction line $100_2$ exceed the critical current. The superconducting junctions 1 constructing the superconducting junction line $100_2$ switched together from the superconducting state to the voltage state. The resistance of the superconducting junction line $100_1$ including one superconducting junction $1_1$ in the voltage state is lower than that of the superconducting junction line $100_2$ in which the superconducting junctions 1 switched together to the voltage state. This time, the bias current exclusively flows to the superconducting junction line $100_1$. The remaining superconducting junctions of the superconducting junction line $100_1$ all switched from the superconducting state to the voltage state ("Applications of Synchronized Switching in Series-Parallel-Connected Josephson Junctions" H. Suzuki et al., IEEE Transactions on Electron Devices, vol. 37, p. 2399, 1990).

The superconducting junctions exhibiting the hysteresis characteristic are used in the superconducting driver circuit shown in FIG. 3. Unless an applied current is lower than a predetermined value, the superconducting junctions which once switched to the voltage state are not returned to the zero-voltage state. When the superconducting junction exhibiting the hysteresis characteristic switched, a voltage value is at millivolt level. It is possible to obtain an output voltage sufficiently higher than 0.1 mV to 0.5 mV as signal voltages of a flux quantum.

SUMMARY OF THE INVENTION

The characteristic and performance necessary for a superconducting driver circuit are as follows.

First, an output voltage above several millivolts can be obtained. In particular, a semiconductor amplifier exhibits a noise characteristic close to 1 mV in a high-frequency region above a gigahertz. A superconducting circuit chip connected to such a semiconductor amplifier must have an output characteristic sufficiently higher than the noise level of a semiconductor circuit.

Second, as the driving power source of a superconducting driver, a DC power source can be used. When operating the superconducting driver by an AC power source having the same frequency as an output signal, a driving voltage which is sufficiently higher than a signal voltage of a flux quantum is reversely flowed in superconducting wiring or is propagated as an electromagnetic wave through the space to be incident upon a flux quantum circuit, thereby causing malfunction operation. The punch-through phenomenon specific for a superconducting junction increases the malfunction probability at 10 GHz or above.

Third, a capacitance tends to form between a SQUID and a ground plane. When there is a capacitance component between the boosted portion of the superconducting driver and the ground plane, the superconducting driver is charged when being switched from the zero-voltage state to the voltage state, and is discharged when being switched from the voltage state to the zero-voltage state. When a boosted voltage is high and the capacitance component is large, the charge and discharge time is longer to inhibit high-speed operation at a gigahertz or above.

Fourth, the occupation area is small. As the integration scale of a superconducting flux quantum circuit is larger and the number of output signals is higher, it is desired that the occupation area is smaller. As the operating frequency is some tens of gigahertz and is higher, the time in which a signal is propagated in the superconducting driver must be 10 picoseconds or below or be sufficiently shorter than this. For this, the size of the superconducting driver circuit must be reduced.

To the characteristic and performance required for such superconducting driver circuit, the prior art superconducting driver circuits used in superconducting flux quantum circuits have the problems described below and are hard to pass a necessary sufficient high-frequency signal from the superconducting circuit to the semiconductor circuit.

The superconducting driver circuit of the construction shown in FIG. 2 has the problems in the first, third and fourth sections. A change in output voltage per SQUID is about 0.1 mV. To obtain an output voltage of several millivolts, some tens of squids must be connected in multiple stages. An effort to lower the capacitance is made by the construction in which only a minimum of ground plane is provided in the SQUID loop. The control line extended from the flux quantum circuit must be connected to the ground plane. The lowering of the capacitance between the control line 21 and the SQUID inductor 7 is limited. To increase a change in output voltage, as the number of stages of SQUIDs is larger, the size is larger to increase the occupation area.

In the superconducting driver circuit of the construction shown in FIG. 3, an alternating current corresponding to the frequency of an output signal must be applied as the driving power source 32. The superconducting junction having hysteresis is not returned from the voltage state to the zero-voltage state unless a source current is once returned to a sufficiently small value. The superconducting driver of this construction can obtain an output voltage of a millivolt per superconducting junction. Due to AC driving, the operating frequency of the driving power source is an obstacle so that the speed of the superconducting driver circuit cannot be increased.

An object of the present invention is to obtain a superconducting driver circuit having the following characteristic and performance. First, an output voltage above several millivolts can be obtained. Second, a DC power source can be used as a driving power source. Third, capacitance is hard to form between a SQUID and a ground plane. Fourth, the occupation area is small.

The present invention takes the following measures for the above objects.

A superconducting driver circuit of the present invention has as a unit a superconducting flux quantum interference device, that is, a SQUID constructing a closed loop by two superconducting junctions and an inductor in which the SQUIDs share the inductors and are connected in series in three or more stages. The SQUIDs connected in series are connected to current bias lines as needed. The current bias lines are alternately connected in the positions near the right and left superconducting junctions of the SQUIDs.

The values of critical currents of the superconducting junctions included in the SQUIDs toward the upper stage (output) side of the superconducting junctions constructing the SQUIDs connected in series are set to lower. A flux quantum signal is inputted from one or two superconducting junction transmission lines to the superconducting junctions of the SQUID in the lowermost stage.

DESCRIPTION OF THE PREFERRED EMBODIMENT

Embodiment I

Figure 1:
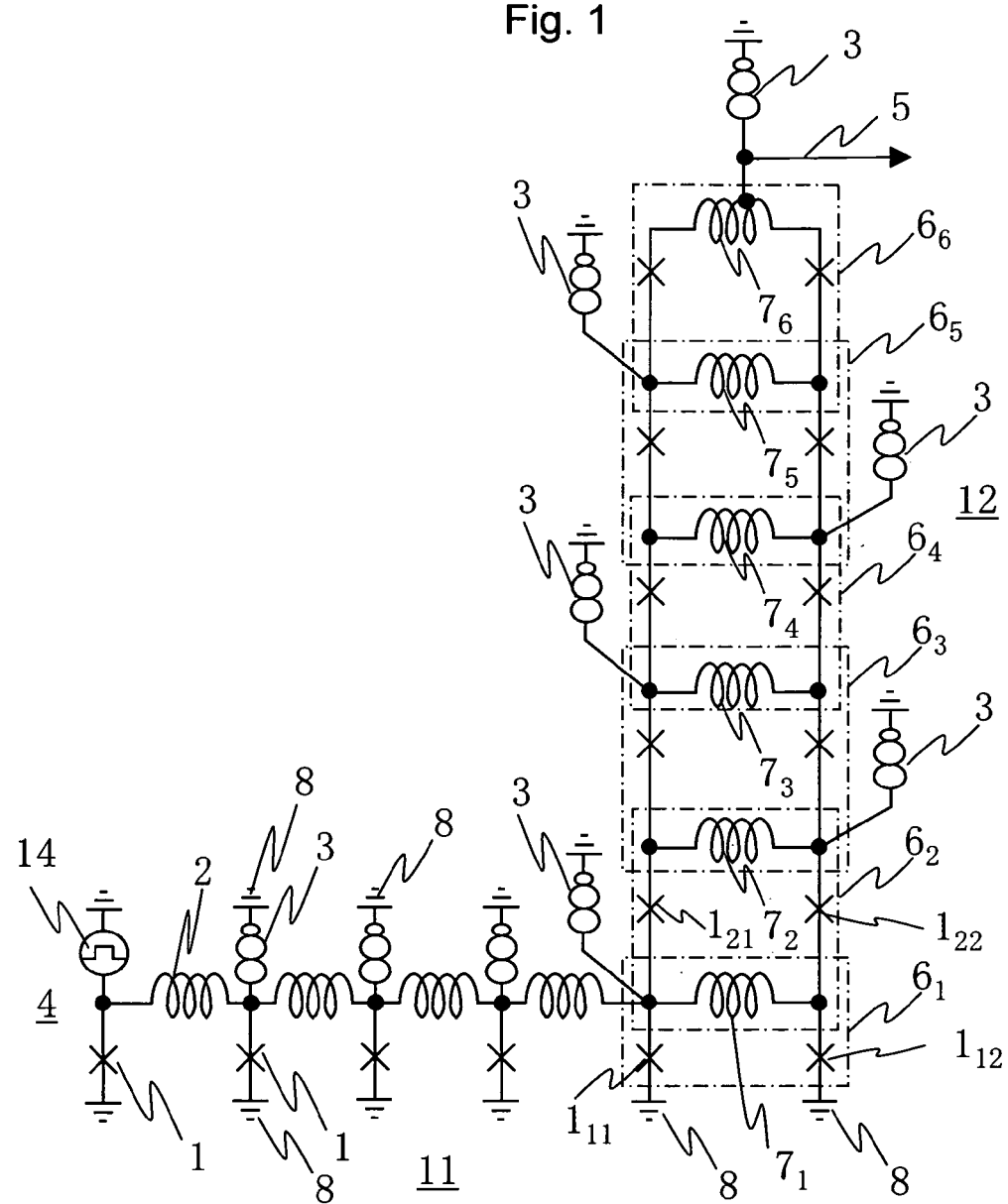
FIG. 1 is a diagram showing a superconducting driver circuit of Embodiment 1 with a superconducting junction transmission line as an input signal line.

FIG. 1 shows a superconducting driver circuit of Embodiment 1 with a superconducting junction transmission line as an input signal line. A superconducting driver circuit 12 has SQUIDs $6_1, 6_2, \ldots, 6_6$ stacked in six stages. Each of the SQUIDs 6 has superconducting junctions 1 on the right and left sides and inductors 7 on the upper and lower sides. The SQUID $6_1$ in the lowermost stage has a loop having an inductor $7_1$ and two superconducting junctions $1_{11}$ and $1_{12}$. The SQUID $6_2$ in the second stage to the SQUID $6_6$ in the uppermost stage each have a loop construction sharing the upper and lower SQUIDs and the inductors 7. For instance, the SQUID $6_2$ has a loop having two inductors $7_1$ and $7_2$ and two superconducting junctions $1_{21}$ and $1_{22}$. The values of critical currents of the superconducting junctions are lower from the SQUID in the lower stage toward the SQUID in the upper stage. Specifically, in FIG. 1, the critical current values of the superconducting junctions 1 are 0.25 mA in the SQUID $6_1$, 0.2 mA in the SQUID $6_2$, 0.15 mA in the SQUID $6_3$, 0.1 mA in the SQUID $6_4$, 0.07 mA in the SQUID $6_5$, and 0.05 mA in the SQUID $6_6$. The critical current values are not necessarily fixed to these values or the ratio of these values.

The values of the inductors 7 are larger from the SQUID in the lower stage toward the SQUID in the upper stage. Specifically, they are 2 pH in the SQUID $6_1$, 4 pH in the SQUID $6_2$, 4 pH in the SQUID $6_3$, 8 pH in the SQUID $6_4$, 8 pH in the SQUID $6_5$, and 16 pH in the SQUID $6_6$. The values of the inductors are not necessarily fixed to these values or the ratio of these values. As a guide of setting, the product of a critical current by an inductor is a half integral multiplier of a flux quantum (2 fWb). In FIG. 1, the product of the critical current by the inductor of each of the SQUIDs is almost ½ of a flux quantum.

DC bias power sources 3 are alternately connected to the right and left shoulders of the SQUIDs. That is, the power sources 3 are connected to the left shoulder of the SQUID $6_1$, the right shoulder of the SQUID $6_2$, the left shoulder of the SQUID $6_3$, the right shoulder of the SQUID $6_4$, the left shoulder of the SQUID $6_5$, and the position shifted to the right side from the center of the inductor $7_6$ in the SQUID $6_6$ in the uppermost stage. An electric current of each of the SQUIDs applied by the bias power source 3 has a value corresponding to the difference between the critical currents of the superconducting junctions thereof and the SQUID in the upper stage.

To examine the operation of the superconducting driver circuit of Embodiment 1, a flux quantum signal as an input signal is introduced via a superconducting junction transmission line 11 into the left shoulder of the SQUID $6_1$ in the lowermost stage. The other end of the superconducting junction transmission line 11 is provided with a flux quantum train generation part 4. In the flux quantum train generation part 4, the superconducting junctions 1 are connected in series to an AC power source 14 for applying a bias current exceeding the critical currents of the superconducting junctions 1 to produce an AC Josephson current. The AC Josephson current is propagated as a flux quantum train in the superconducting junction transmission line 11. The propagation frequency of flux quanta is increased according to the bias current of the AC power source 14. Here, an alternating current in which a finite current value exceeding a zero current and a critical current is an amplitude is used as the AC power source 14 as a bias current source.

Figure 4:
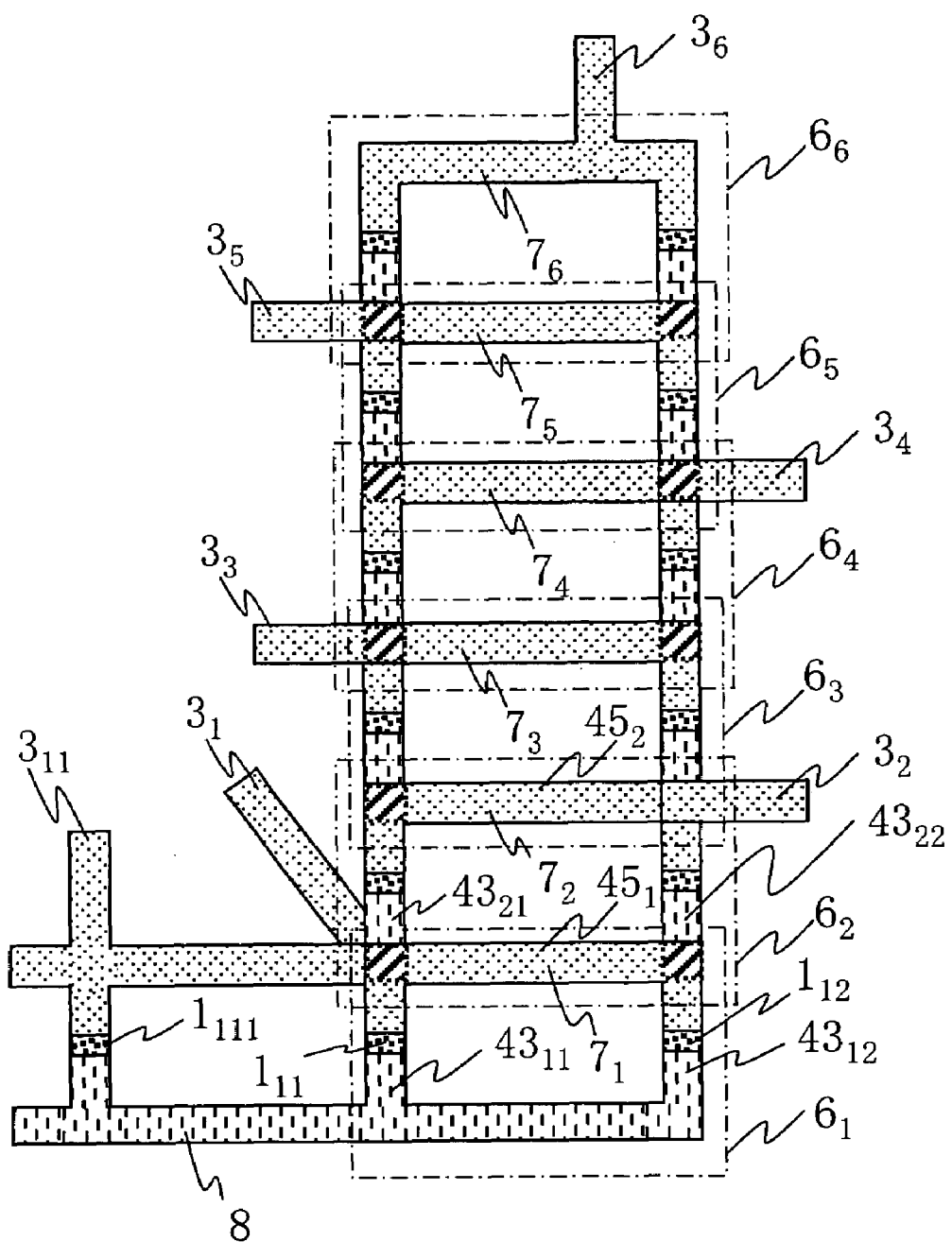
FIG. 4 is a diagram showing an example of layout in which the superconducting driver circuit of Embodiment 1 is constructed by a superconducting thin film and an insulator film of oxide.
Figure 5:
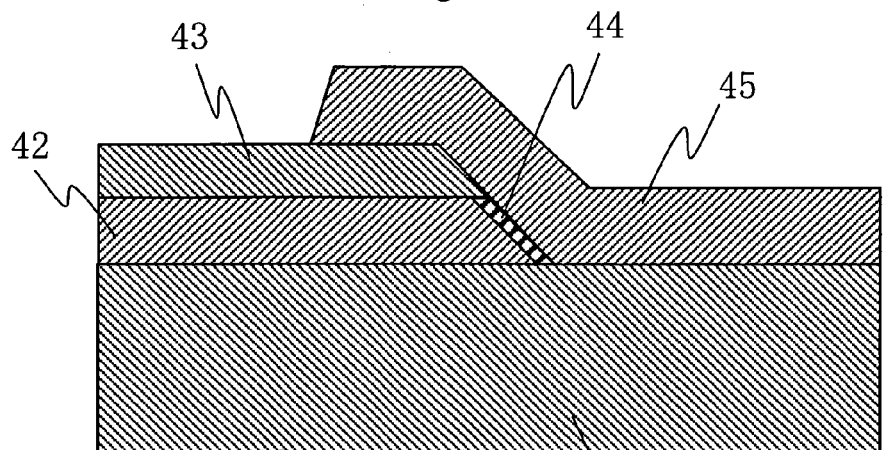
FIG. 5 is a diagram showing a cross section by noting the superconducting junction by the layout shown in FIG. 4.

FIG. 4 is a diagram showing an example of layout in which the superconducting driver circuit of Embodiment 1 is constructed by a superconducting thin film and an insulator film of oxide. FIG. 5 is a diagram showing a cross section by noting the superconducting junction. In FIG. 4, to easily see correspondence with the circuit of FIG. 1, for simplification, the insulator film shown in FIG. 5 is omitted.

The superconducting junction 1 of the superconducting driver circuit of Embodiment 1 will be described with reference to FIG. 5. The superconducting junction 1 is of a ramp edge type in which yttrium-barium-copper oxide thin films are used as an upper electrode film 45 and a lower electrode film 42. A junction barrier layer 44 is a surface damage layer formed by illuminating the edge surface of the lower electrode film formed with a slope with an ion beam. A single crystal and thin film of lanthanum-strontium-aluminum-tantalum oxide are used for a substrate 41 and a interlayer insulator film 43 between the electrode films. No ground planes are provided.

In the layout of FIG. 4, for instance, the upper electrode film $45_1$ of the SQUID $6_1$ in the lowermost stage has an inverted U-shaped pattern. The superconducting junctions $1_{11}$ and $1_{12}$ are formed between the upper electrode film 45, and the lower electrode films $43_{11}$ and $43_{12}$ arranged in both sides of the inverted U-shape. The other end of the lower electrode film $43_{11}$ and the other end of the lower electrode film $43_{12}$ are connected to wiring 8 as a ground line. The wiring 8 is a necessary pattern as part of the lower electrode film 43. The upper side of the inverted U-shaped pattern corresponds to the inductor $7_1$. The SQUID $6_2$ in the next stage is formed by the same pattern as the SQUID $6_1$. The other end of each of both sides of the inverted U-shape connected to the wiring 8 as a ground line in the SQUID $6_1$ is connected to the shoulder portion of the upper side of the inverted U-shaped pattern of the SQUID $6_1$. Here, the portion indicated by the hatching in the lower leftward direction means that the connecting parts of the upper electrode film 45 and the lower electrode film 43 are connected by maintaining the superconducting state. The wiring $3_1$ to be connected to the bias power source 3 is drawn out from the left shoulder of the SQUID $6_1$. The wiring $3_2$ to be connected to the bias power source 3 is drawn out from the right shoulder of the SQUID $6_2$. The wiring $3_6$ to be connected to the bias power source 3 and the output line is drawn out from the upper electrode film 45 of the SQUID $6_6$ in the uppermost stage. The wirings $3_1$ to $3_6$ are in a necessary pattern as part of the upper electrode film 45. On the left side of the SQUID $6_1$ in the lowermost stage, there is the upper electrode film 45 constructing the superconducting junction transmission line 11 connected thereto. There are shown the superconducting junction constructed by the upper electrode film 45 and the lower electrode film 43 and the wiring $3_{11}$ connected to the bias power source 3. In comparison of FIG. 4 with FIG. 1, it is easily understood that the layout of FIG. 4 is of the same shape as the circuit.

As described above, for the path 8 of a returning current of the superconducting flux quantum circuit, the lower electrode film 43 of the superconducting junction are used as wiring. In part of the wiring $3_6$ as an output line 5 of the superconducting driver circuit, in order to suitably set an impedance, the lower electrode film is used as a ground line to be disposed to be close to the output line 5, which is of a coplanar type. This can obtain impedance matching of the superconducting circuit chip with the external circuit.

In such a circuit construction, the product of a critical current Ic by a resistance Rn in the voltage state of the superconducting junction, that is, an IcRn value was 2 mV at a temperature of 4.2 K. The superconducting driver circuit exhibited the operation characteristic shown below. When applying an alternating current to the flux quantum train generation part, a generated voltage in the superconducting junction transmission line was 0.8 mV. This corresponds to 400 GHz as the generation frequency of flux quantum trains.

An output voltage of the superconducting driver circuit was 4 mV, which was able to amplify the input voltage to five times.

Figure 6:
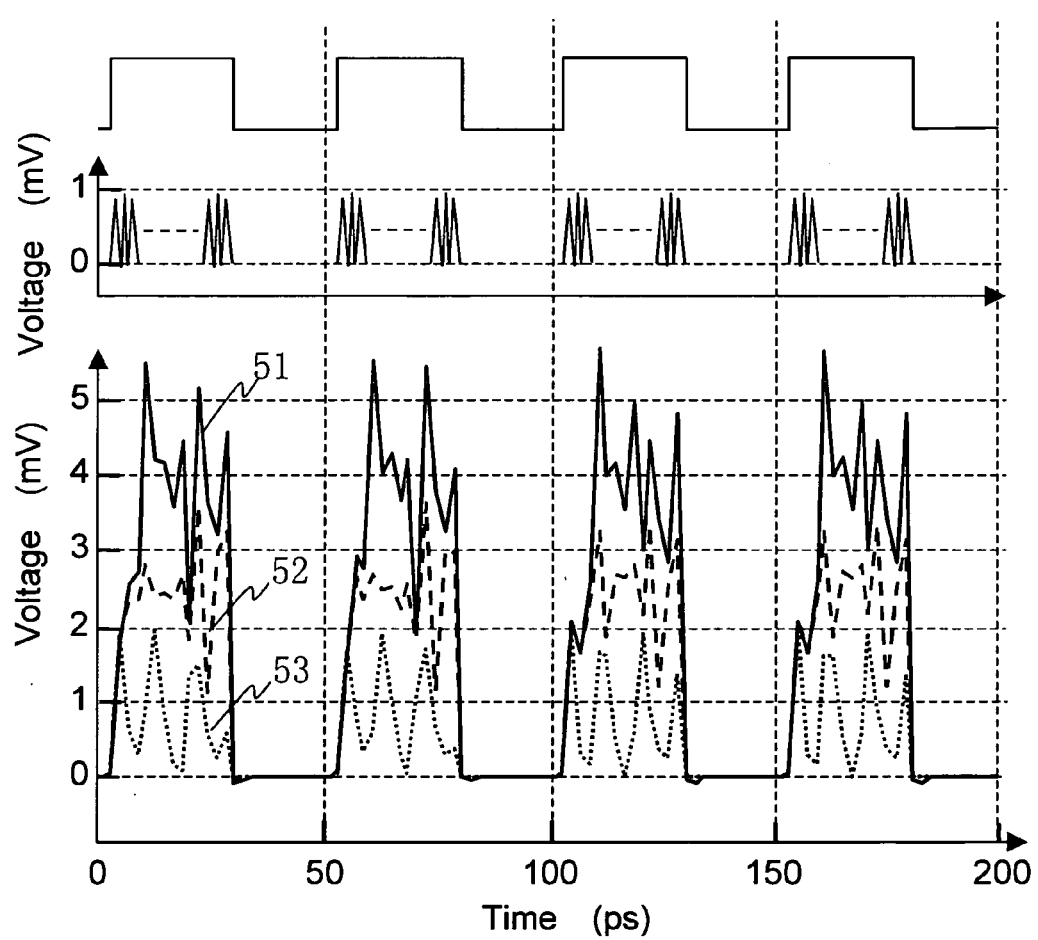
FIG. 6 is a diagram showing the high-frequency characteristic of output voltages of the superconducting driver circuit of Embodiment 1.

FIG. 6 is a diagram showing the high-frequency characteristic of output voltages of the superconducting driver circuit of Embodiment 1. An alternating current waveform of the AC power source 14 is shown in the upper stage, flux quantum trains generated thereby are shown in the next stage, and output voltage waveforms of the superconducting driver circuit are shown in the lower stage. In the drawing, the numeral 51 denotes an output voltage of the SQUID $6_6$ in the uppermost stage, the numeral 52 denotes an output voltage of the SQUID $6_3$ in the third stage, and the numeral 53 denotes an output voltage of the SQUID $6_1$ in the lowermost stage. A higher generated voltage is found to be exhibited toward the SQUID in the upper stage. The superconducting driver circuit sufficiently follows the operating frequency of 20 GHz. In the judgment from the steeping of the waveform, this superconducting driver circuit permits the amplifying function to a signal having a higher frequency.

The operating principle of this superconducting driver circuit is as follows. In the SQUIDs $6_1$ to $6_6$ connected in series, information on a flux quantum signal is transmitted from the SQUID $6_1$ in the lowermost stage to the SQUID $6_6$ in the uppermost stage via the shared inductors 7. As a result, the SQUIDs 6 are switched together between the zero-voltage state and the voltage state to generate a voltage obtained by adding the output voltages of the SQUIDs 6.

The bias current sources 3 supply a DC bias current to the SQUIDs in the respective stages. The SQUIDs are in the zero-voltage state and are held in the state near the critical point. When a flux quantum passes through the SQUID $6_1$ in the lowermost stage of the superconducting driver circuit, a loop current with the flux quantum flows into the inductor $7_1$. The loop current is added to the bias current. The SQUID $6_1$ in the lowermost stage is switched to the voltage state.

The electric current added to the inductor $7_1$ of the SQUID $6_1$ in the lowermost stage also flows to the loop of the SQUID $6_2$ in the second stage. The SQUID $6_2$ in the second stage is also switched from the superconducting state to the voltage state. In the same manner, the SQUID loop current in the lower stage with the inputted flux quantum is transmitted to the SQUID in the upper stage via the inductor shared between two SQUIDs in the upper and lower relation. The SQUIDs connected in series are sequentially switched to the voltage state. The basic operation is introduced in the thesis of Kaplunenko et al. ("Voltage Divider Based on Submicron Slits in A High-Tc Superconducting Film and Two Bicrystal Grain Boundaries" V. K. Kaplunenko et al., Applied Physics Letters, vol. 67, p. 282, 1995).

In order that the loop currents of the SQUIDs are sequentially propagated and the SQUIDs are switched from the zero-voltage state to the superconducting state, suitable bias currents must be applied to the SQUIDs. The bias currents all pass through a ground potential or a shared potential to be returning currents. Essentially, the flowing current level is higher toward the SQUID positioned in the lower stage. In response to this, the critical currents of the superconducting junctions must be higher. By way of example, in Embodiment 1, as described above, the critical current values of the superconducting junctions 1 are 0.25 mA in the SQUID $6_1$, 0.2 mA in the SQUID $6_2$, 0.15 mA in the SQUID $6_3$, 0.1 mA in the SQUID $6_4$, 0.07 mA in the SQUID $6_5$, and 0.05 mA in the SQUID $6_6$.

The superconducting driver circuit according to Embodiment 1 was able to generate an output voltage of several millivolts in the SQUIDs in six stages. When using wiring having a width of several microns, the superconducting driver circuit can be constructed by the size of 0.1 mm or below. The occupation area of the superconducting driver circuit can be much smaller than about 1 mm of the prior art SQUID type.

Figure 2:
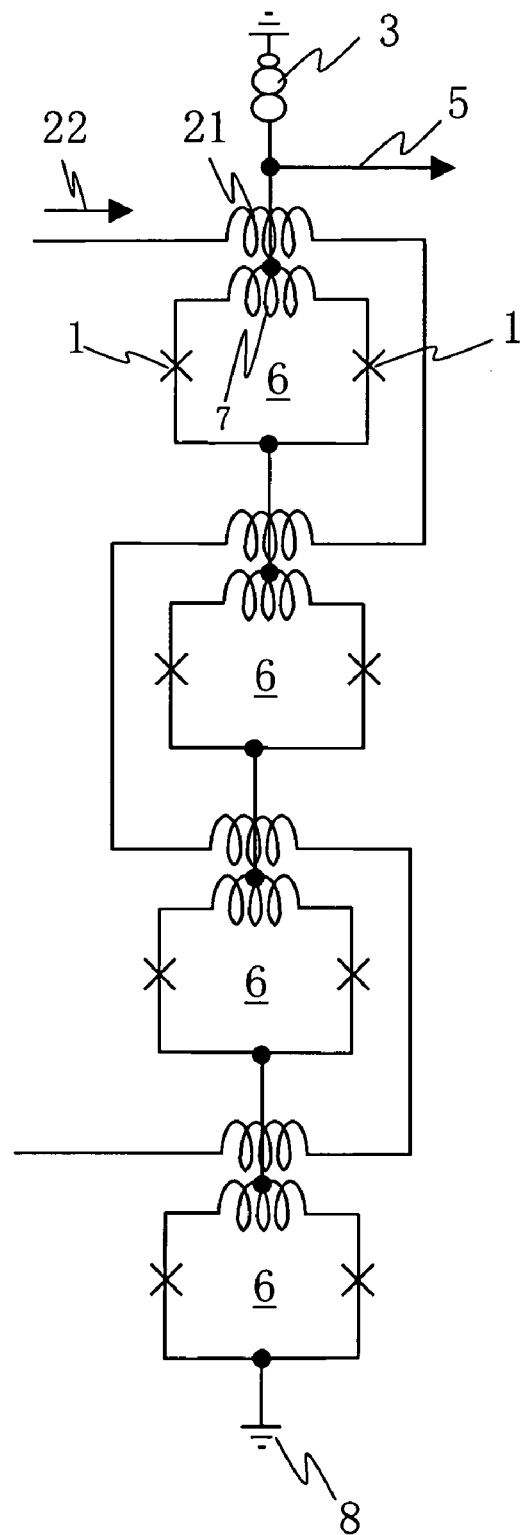
FIG. 2 is a diagram showing a constructional example of a SQUID type superconducting driver circuit with a control line which has been used.
Figure 3:
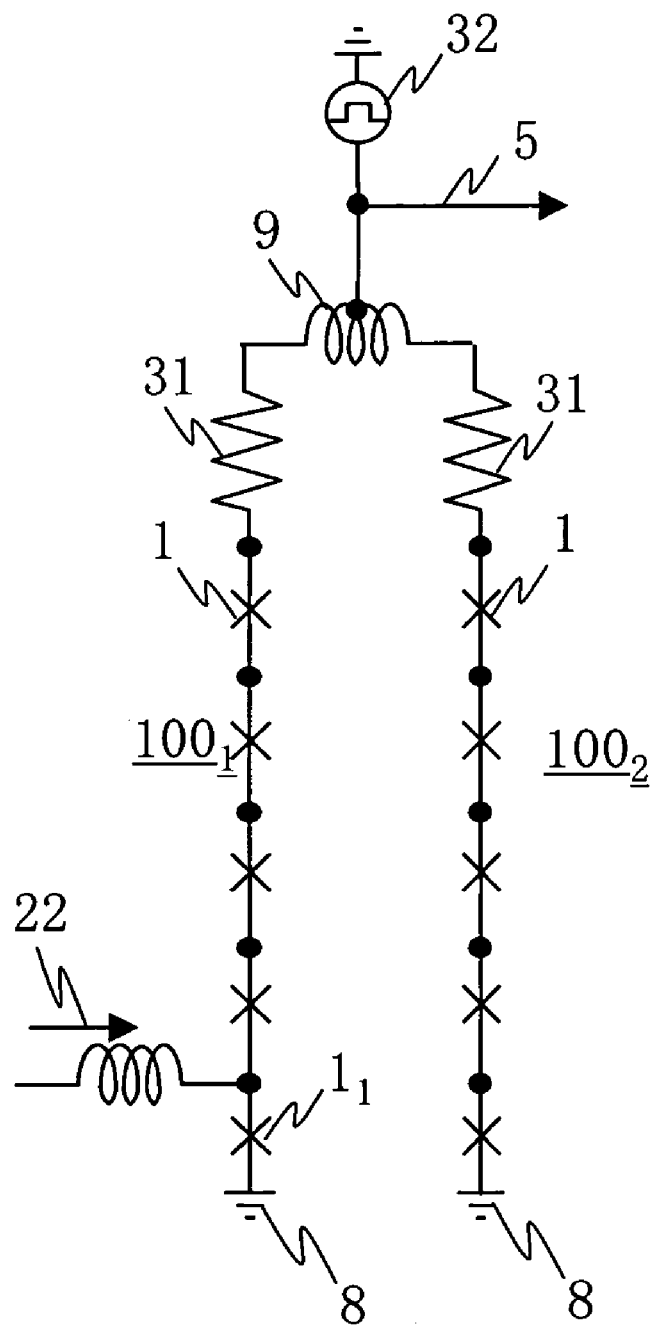
FIG. 3 is a diagram showing another constructional example of a superconducting driver circuit using superconducting junction lines which has been used.

As is apparent from the comparison of the superconducting driver circuit of Embodiment 1 with that of FIG. 2, in Embodiment 1, no magnetic coupling to an input signal is required, that is, the SQUID lines connected in series are switched by current injection. As compared with the case of performing magnetic coupling, there is no overlap with a magnetic coupling line grounded. The capacitance component of the ground potential plane or the ground plane can be small. The superconducting driver circuits of Embodiment 1 are all driven by a direct current. The high-frequency characteristic of some tens of gigahertz can be easily exhibited. It can be widely applied to the superconducting flux quantum circuit.

The superconducting driver circuit of Embodiment 1 can be constructed only by two superconducting films necessary for constructing the superconducting junction and one interlayer insulator film. The superconducting driver circuit can also be constructed by adding one superconducting film as a ground plane and one interlayer insulator film to flow a returning current to the ground plane. In this circuit construction, to secure the operation in the high-frequency region, no ground planes may be laid other than the region formed with the SQUID $6_1$ in the lowermost stage.

In Embodiment 1, for convenience of the layout, the bias currents in the respective stages are alternately supplied from the left and right shoulders. When setting suitable bias currents, it is apparent that they may be supplied from the same direction.

In Embodiment 1, the superconducting driver circuit is constructed by a superconducting thin film of oxide. The superconducting driver circuit can also be constructed by a superconducting thin film of a metal such as niobium or niobium nitride.

Embodiment II

Figure 7:
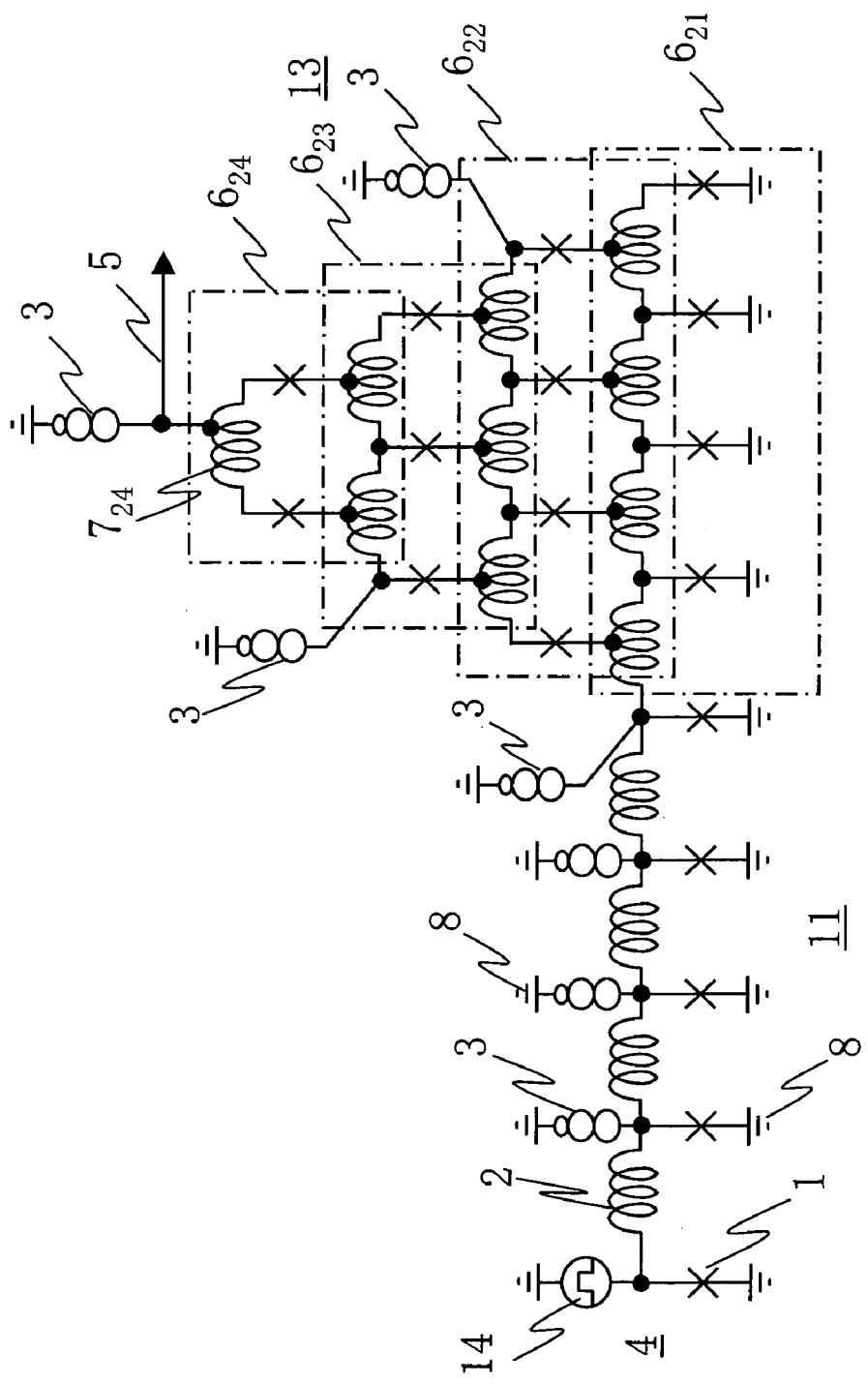
FIG. 7 is a diagram showing a superconducting driver circuit of Embodiment 2 with a superconducting junction transmission line as an input signal line.

FIG. 7 shows a superconducting driver circuit of Embodiment 2 with a superconducting junction transmission line as an input signal line. A superconducting driver circuit 13 has SQUIDs $6_{21}$, $6_{22}$, ..., $6_{24}$ are stacked in four stages. As is understood from the comparison with FIG. 1, the superconducting driver circuit of Embodiment 2 has one SQUID $6_{24}$ in the uppermost stage, two SQUIDs $6_{23}$ in the next stage, three SQUIDs $6_{22}$ in the stage after next, and four SQUIDs $6_{21}$ in the lowermost stage are connected in parallel, respectively. An inductor 7 is shared between the upper and lower SQUIDs. The adjacent SQUIDs connected in parallel share a superconducting junction.

The critical currents of the superconducting junctions 1 constructing the SQUIDs are all values almost equal to each other. The values of the sums of the critical currents of the superconducting junctions in the respective stages are lower from the SQUID in the lower stage toward the SQUID in the upper stage. The inductance values of the inductors of the respective SQUID loops are almost equal values. In Embodiment 2, as in Embodiment 1, the DC bias power sources 3 are alternately connected to the right and left shoulders of the SQUIDs. That is, the power sources 3 are connected to the left shoulder of the SQUID $6_{21}$, the right shoulder of the SQUID $6_{22}$, the left shoulder of the SQUID $6_{23}$, and the position shifted to the right side from the center of the inductor $7_{24}$ of the SQUID $6_{24}$ in the uppermost stage.

The applied current of each of the SQUID lines is a value corresponding to the difference between the sums of the critical currents of the superconducting junctions thereof and the SQUID line in the upper stage.

To examine the operation of the superconducting driver circuit of Embodiment 2, a flux quantum signal as an input signal is introduced via a superconducting junction transmission line 11 into the left shoulder of the SQUID $6_{21}$ in the lowermost stage. The other end of the superconducting junction transmission line 11 is provided with a flux quantum train generation part 4. The construction of the flux quantum train generation part 4 is the same as that of Embodiment 1.

Figure 8:
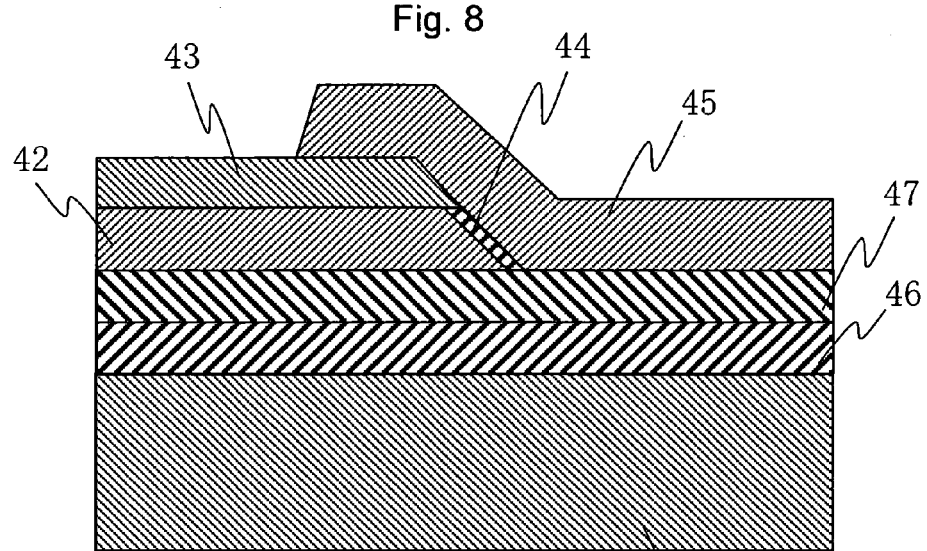
FIG. 8 is a diagram showing a cross-sectional construction by noting the superconducting junction of an example in which the superconducting driver circuit of Embodiment 2 is constructed by a superconducting thin film and an insulator film of oxide.

FIG. 8 is a diagram showing a cross-sectional construction by noting the superconducting junction of an example in which the superconducting driver circuit of Embodiment 2 is constructed by a superconducting thin film and an insulator film of oxide. The superconducting driver circuit is the same as that of Embodiment 1 except that a ground plane 46 is provided via an interlayer insulator film 47. An example of layout in which the superconducting driver circuit of Embodiment 2 is constructed by a superconducting thin film and an insulator film of oxide can be constructed as in the correspondence of the circuit of FIG. 1 with the layout of FIG. 4 in Embodiment 1. The drawing thereof is omitted.

The ground plane 46 of Embodiment 2 may be provided in the entire region as a magnetic shield film. In the region portion in which the superconducting driver circuit is constructed, the ground plane 46 is laid only in the region portion of the SQUID $6_{21}$ in the lowermost stage. In the region portion in which the SQUIDs in the second stage to the uppermost stage of the superconducting driver circuit are constructed, no ground planes are laid.

In such a circuit construction, the product of a critical current Ic by a resistance Rn in the voltage state of the superconducting junction, that is, an IcRn value was 2 mV at a temperature of 4.2 K. The superconducting driver circuit exhibited the operation characteristic shown below. When applying an alternating current to the flux quantum train generation part, a generated voltage in the superconducting junction transmission line was 0.8 mV. An output voltage of the superconducting driver circuit was 2.5 mV or above, which was able to amplify the input voltage to three times or more.

Figure 9:
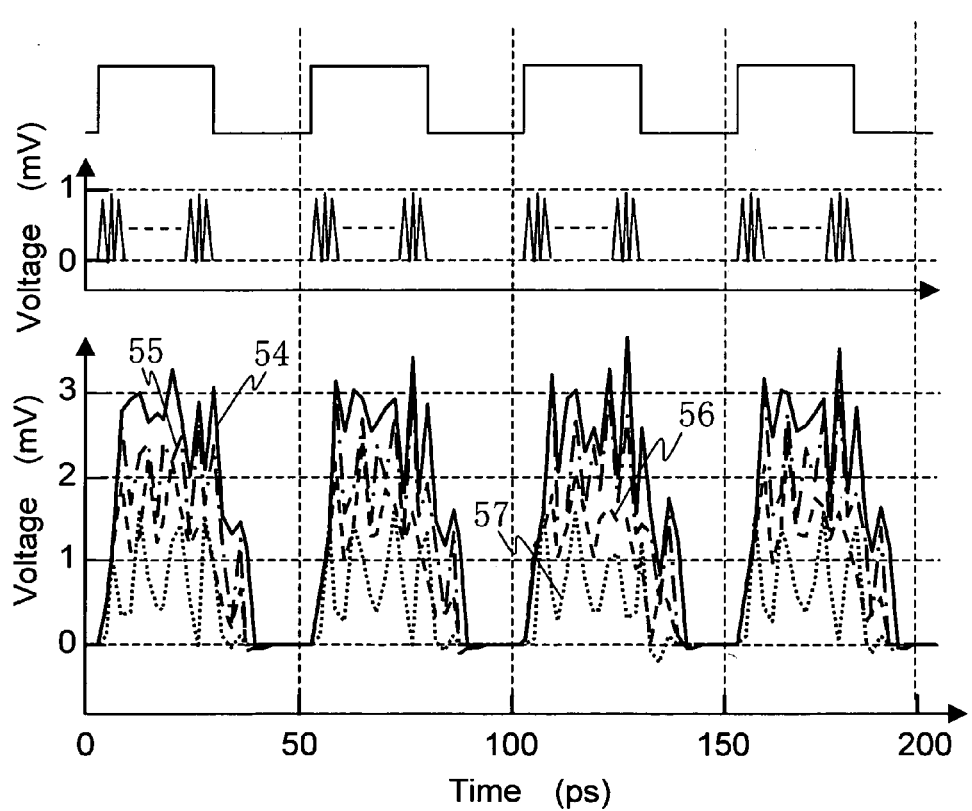
FIG. 9 is a diagram showing the high-frequency characteristic of output voltages of the superconducting driver circuit of Embodiment 2.

FIG. 9 is a diagram showing the high-frequency characteristic of output voltages of the superconducting driver circuit of Embodiment 2. An AC waveform of an AC power source 14 is shown in the upper stage, flux quantum trains generated thereby are shown in the next stage, and output voltage waveforms of the superconducting driver circuit are shown in the lower stage. In the drawing, the numeral 54 denotes an output voltage of the SQUID $6_{24}$ in the uppermost stage, the numeral 55 denotes an output voltage of the SQUID $6_{23}$ in the third stage, the numeral 56 denotes an output voltage of the SQUID $6_{22}$ in the second stage, and the numeral 57 denotes an output voltage of the SQUID $6_{21}$ in the lowermost stage. A higher generated voltage is found to be exhibited toward the SQUID in the upper stage. The superconducting driver circuit sufficiently follows the operation frequency of 20 GHz. In judgment from the steeping of the waveform, this superconducting driver circuit permits the amplifying function to a signal having a higher frequency.

The superconducting driver circuit of Embodiment 2 can be constructed by arraying the superconducting junctions having almost the same size and almost equal critical currents and inductors having almost the same size. It is relatively easy to manufacture the circuit as designed. To increase the output voltage, when increasing the number of stages of the SQUID line, it is possible to cope with change in design and layout relatively easily.

Embodiment III

Figure 10:
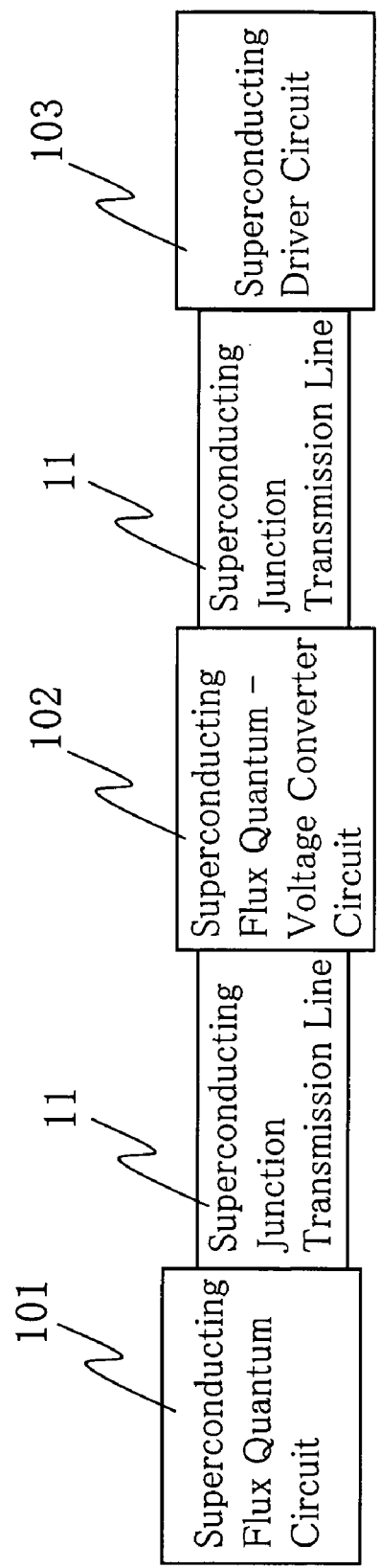
FIG. 10 is a block diagram showing a constructional example of a superconducting circuit in which the superconducting driver circuit according to the present invention is coupled to a superconducting flux quantum circuit.

FIG. 10 is a block diagram showing a constructional example of a superconducting circuit in which the superconducting driver circuit according to the present invention is coupled to a superconducting flux quantum circuit. The entire superconducting circuit has a superconducting flux quantum circuit 101, a superconducting flux quantum-voltage converter circuit 102, and a superconducting driver circuit 103. These circuits are connected by superconducting junction transmission lines 11. The superconducting flux quantum circuit 101 is a circuit performing various kinds of logic processing using a flux quantum as a signal. The superconducting driver circuit 103 is the above-described circuit as Embodiment 1 or 2.

Figure 11:
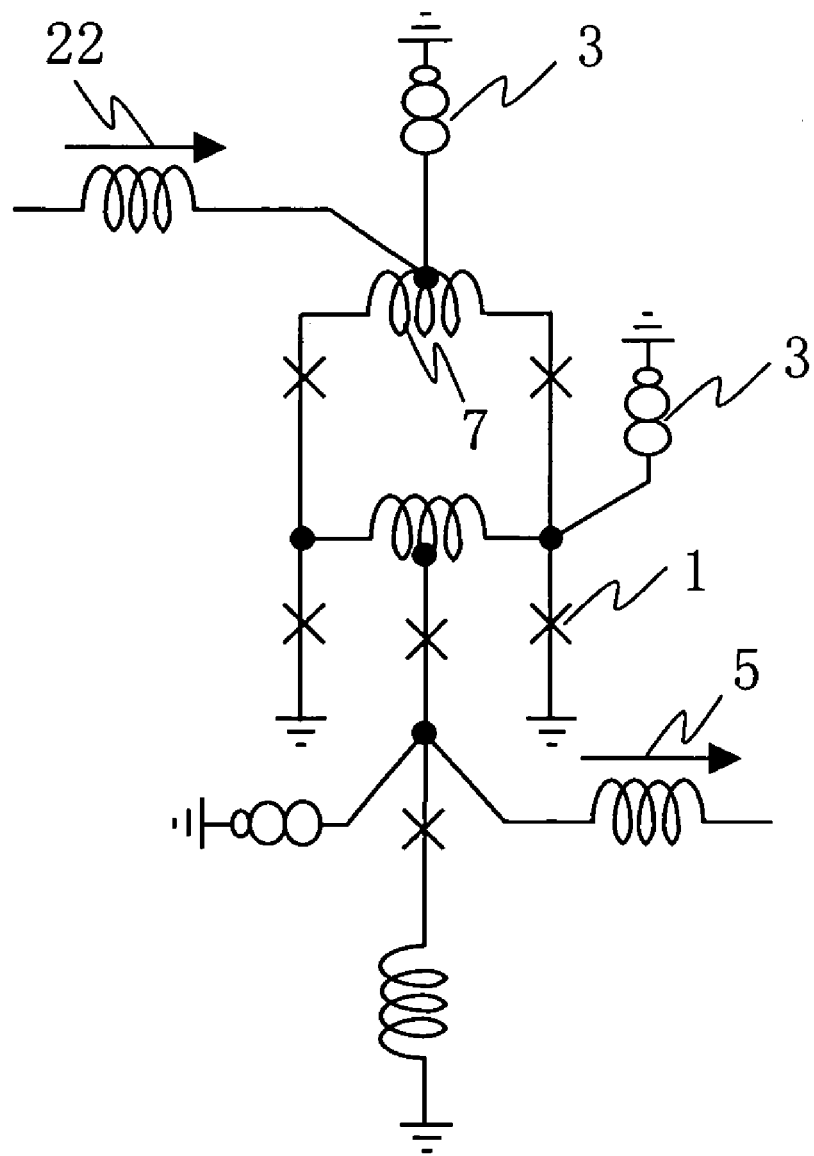
FIG. 11 is a diagram showing a circuit example of the superconducting flux quantum-voltage converter circuit.

FIG. 11 shows a circuit example of the superconducting flux quantum-voltage converter circuit. The superconducting flux quantum-voltage converter circuit is a circuit which continuously generates a flux quantum train as an output 5 for each reaching of a flux quantum 22 to be brought to the voltage state and stops flux quantum train generation by reaching of the next flux quantum 22. For each reaching of the flux quantum 22, such flux quantum train generation and stop are repeated. As described above, the superconducting driver circuit 103 receiving as an input a signal in which such flux quantum train generation and stop are repeated amplifies a voltage corresponding to the frequency of flux quantum trains generated by the superconducting flux quantum-voltage converter circuit 102.

In Embodiment 3, the construction of the superconducting driver 103 is almost the same as that of Embodiment 1. That is, SQUIDs are stacked in six stages, and the SQUIDs have superconducting junctions on the right and left sides and the inductors are provided in the upper and lower stages. The inductor is shared between the upper and lower SQUIDs. The values of critical currents of the superconducting junctions are lower from the SQUID in the lower stage toward the SQUID in the upper stage. DC power source lines are connected alternately to the right and left shoulders of the respective SQUIDs. In the SQUID in the uppermost stage, the power source line is connected to the position shifted from the center of the inductor. The superconducting driver circuit is constructed by a superconducting thin film and insulator film of oxide. Its cross-sectional construction is the same as that shown in FIG. 8. The ground plane and the superconducting junction are of the ramp edge type in which yttrium-barium copper oxide thin films are upper and lower electrodes. A single crystal and thin film of lanthanum-strontium-aluminum-tantalum oxide are used for a substrate and the interlayer insulator film between the electrodes.

The ground planes are laid in the superconducting flux quantum circuit portion and the path of a returning current thereof, the superconducting junction transmission line connected to the superconducting driver circuit, the SQUID in the lowermost stage of the superconducting driver circuit, and the output line of the superconducting driver circuit. No ground planes are laid in the SQUIDs in the second stage to the uppermost stage of the superconducting driver circuit.

In such circuit construction, the product of a critical current Ic by a resistance Rn in the voltage state of the superconducting junction, that is, an IcRn value was 2 mV at a temperature of 4.2 K. An output voltage of the superconducting flux quantum-voltage converter circuit was 0.44 mV. The output voltage corresponds to 220 GHz as the flux quantum generation frequency. A flux quantum train from the superconducting flux quantum-voltage converter circuit was inputted to the superconducting driver circuit. An output voltage of 2 mV was obtained by the superconducting driver circuit.

Figure 12:
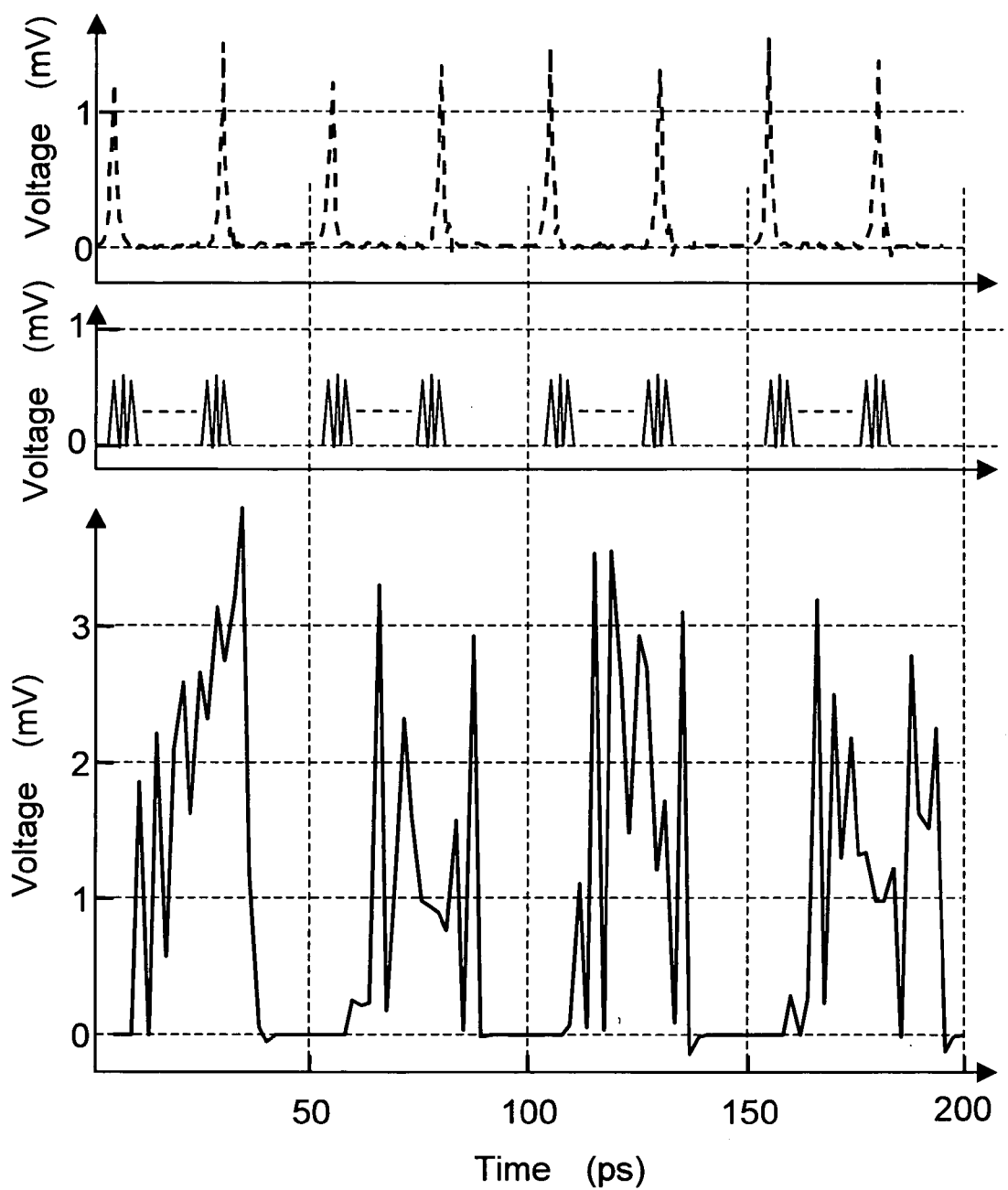
FIG. 12 is a diagram showing a flux quantum waveform in the upper stage, an output voltage waveform of the superconducting flux quantum-voltage converter circuit in the middle stage, and a voltage waveform of the superconducting driver circuit in the lower stage.

FIG. 12 is a diagram showing a flux quantum waveform in the upper stage, output voltage waveforms of the superconducting flux quantum-voltage converter circuit in the middle stage, and a voltage waveform of the superconducting driver circuit in the lower stage. It is found that flux quantum train generation and stop are repeated for each reaching of the flux quantum 22 to obtain a voltage corresponding to the frequency of flux quantum trains generated by the superconducting flux quantum-voltage converter circuit 102 from the superconducting driver circuit 103 receiving as an input a signal in which such flux quantum train generation and stop are repeated.

The superconducting driver circuit amplifies an output signal of the superconducting flux quantum circuit. It is important that a produced voltage signal not be reversely flowed to the superconducting flux quantum circuit. The reverse flow of a voltage pulse becomes noise to the superconducting flux quantum circuit. The flux quantum train generated by the superconducting flux quantum-voltage converter circuit 102 of the construction shown in Embodiment 3 is not reversely flowed to the superconducting flux quantum circuit. The electric current flowed to the superconducting junction is not particularly varied. This is understood from the operation waveform shown in FIG. 12. It is apparent that the waveform (in the upper stage) of the flux quantum inputted to the superconducting flux quantum-voltage converter circuit is not affected at all by the voltage of the superconducting driver circuit shown in the lower stage. In the drawing, no returning current from the superconducting driver circuit 103 appears at all. It is found that a produced voltage (flux quantum signal) in the junction is the same as the case that the superconducting driver circuit is not connected.

The superconducting driver circuit according to the present invention is coupled to the superconducting flux quantum circuit via the superconducting flux quantum-voltage converter circuit to construct the superconducting circuit. It is possible to construct the superconducting circuit which causes no noise to the superconducting flux quantum circuit itself and cannot affect the operation margin of the superconducting flux quantum circuit.

Embodiment IV

Figure 13:
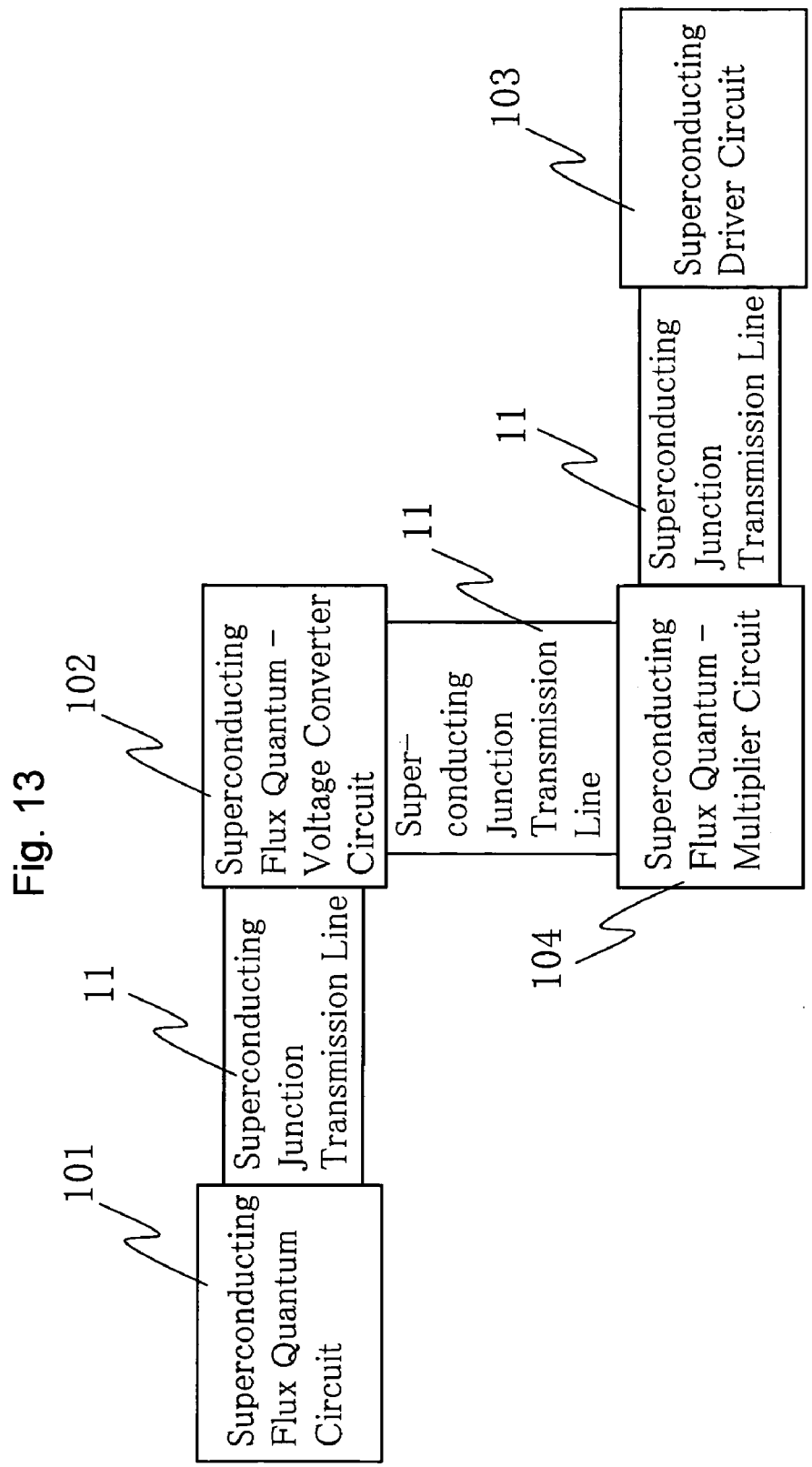
FIG. 13 is a block diagram showing another constructional example of a superconducting circuit in which the superconducting driver circuit according to the present invention is coupled to a superconducting flux quantum circuit.

FIG. 13 is a block diagram showing another constructional example of a superconducting circuit in which the superconducting driver circuit according to the present invention is coupled to a superconducting flux quantum circuit. The entire superconducting circuit has a superconducting flux quantum circuit 101, a superconducting flux quantum-voltage converter circuit 102, a superconducting flux quantum multiplier circuit 104, and a superconducting driver circuit 103. These circuits are connected by superconducting junction transmission lines 11. As is apparent from comparison of FIG. 10 with FIG. 13, in Embodiment 4, they are the same except that the superconducting flux quantum multiplier circuit 104 is inserted between the superconducting flux quantum-voltage converter circuit 102 and the superconducting driver circuit 103.

As described above, the superconducting driver circuit 103 can obtain a voltage corresponding to the frequency of inputted flux quantum trains. To obtain a high output voltage, it is useful to increase the frequency of inputted flux quantum trains. The superconducting flux quantum multiplier circuit 104 is inserted for this reason.

Figure 14:
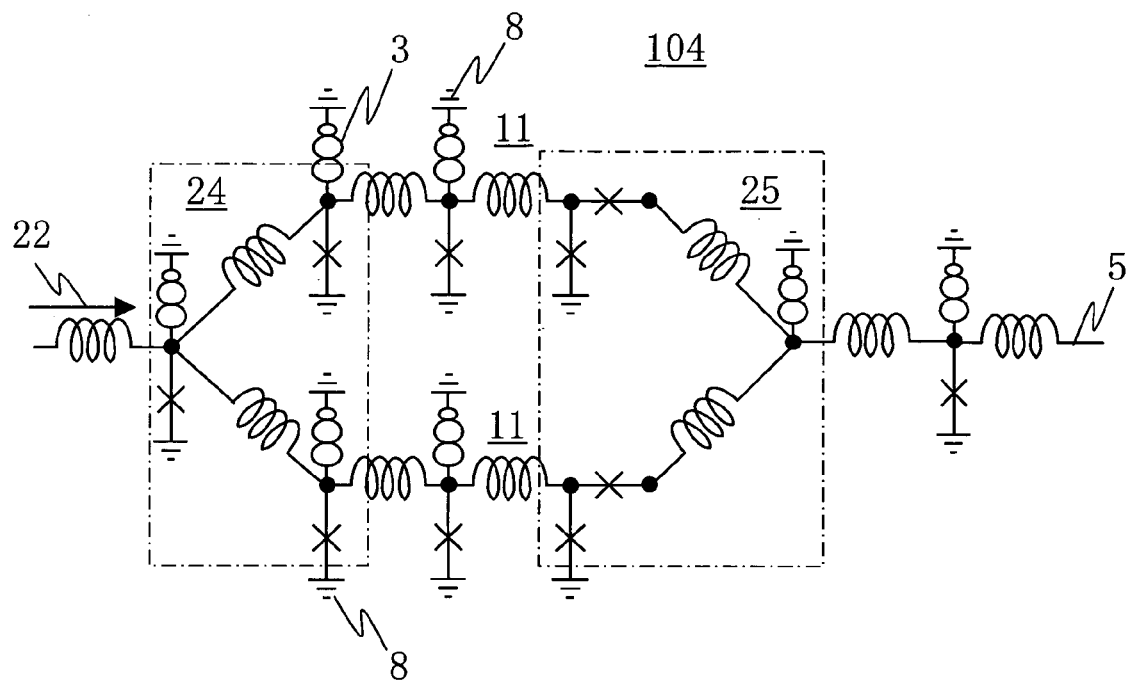
FIG. 14 is a diagram showing an example of a superconducting flux quantum multiplier circuit increasing one inputted flux quantum to two for output.

FIG. 14 shows an example of a superconducting flux quantum multiplier circuit which increases one inputted flux quantum to two for output. The superconducting flux quantum multiplier circuit has a branching circuit 24 to which one flux quantum 22 is inputted, the superconducting junction transmission lines 11 for propagating two outputs of the branching circuit 24, and a confluence buffer 25 inputting two flux quanta outputted from the superconducting junction transmission lines 11 to output two flux quantum trains. The confluence buffer 25 has two input lines and one output line 5. The flux quanta pass from the respective input lines through the output line. It is possible to prevent the flux quantum from passing from one of the input lines through the other input line and the flux quantum from reversely flowing from the output line to the input lines. In this circuit, even when the propagation speeds of the two flux quanta produced by the branching circuit 24 are the same, they are outputted as two flux quantum trains.

The superconducting flux quantum multiplier circuit 104 shown in FIG. 14 doubles the frequency of flux quantum trains for input to the superconducting driver circuit 103. The superconducting flux quantum multiplier circuit 104 is inserted to make the output voltage almost double.

As shown in FIG. 14, there is only one superconducting flux quantum multiplier circuit. It is possible to connect two or more superconducting flux quantum multiplier circuits in series. When two superconducting flux quantum multiplier circuits are arrayed, the frequency of flux quantum trains is four times. When three superconducting flux quantum multiplier circuits are arrayed, the frequency of flux quantum trains is eight times. When the frequency of flux quantum trains of the superconducting flux quantum multiplier circuit is larger than a value corresponding to IcRn of the superconducting junction, the multiplying function is suppressed. The frequency of flux quantum trains corresponding to 1 mV of the IcRn value corresponds to 500 GHz.

Embodiment V

Figure 15:
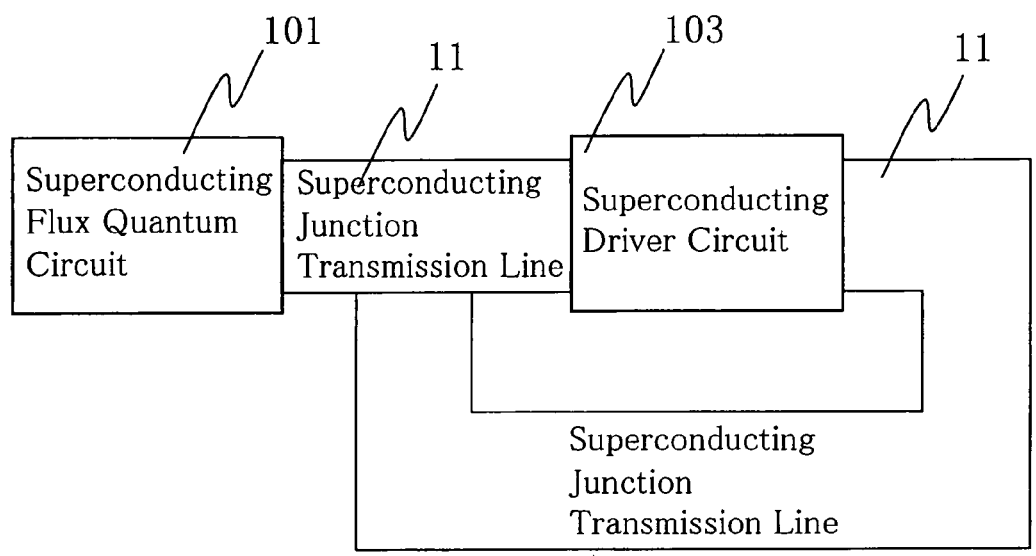
FIG. 15 is a block diagram showing a further constructional example of a superconducting circuit in which the superconducting driver circuit according to the present invention is coupled to a superconducting flux quantum circuit.
Figure 16:
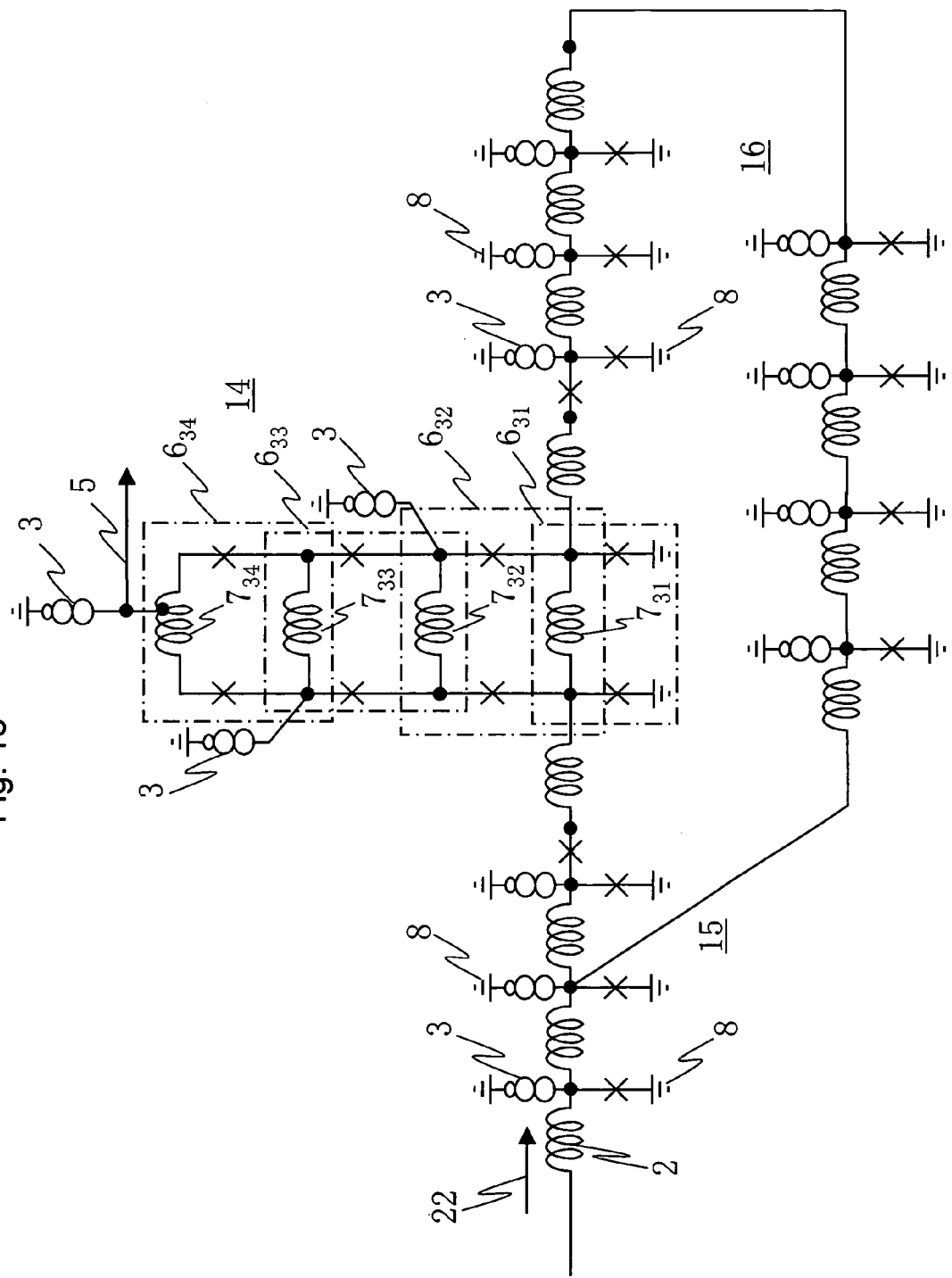
FIG. 16 is a diagram showing a specific example of a superconducting driver circuit applied to Embodiment 5 and superconducting junction transmission lines for adding a flux quantum signal thereto.

FIG. 15 is a block diagram showing a further constructional example of a superconducting circuit in which the superconducting driver circuit according to the present invention is coupled to a superconducting flux quantum circuit. FIG. 16 is a diagram showing a specific example of a superconducting driver circuit applied to Embodiment 5 and superconducting junction transmission lines for adding a flux quantum signal thereto. The entire superconducting circuit has a superconducting flux quantum circuit 101 and a superconducting driver circuit 103. The superconducting driver circuit 103 is set and reset by a flux quantum signal outputted from the superconducting flux quantum circuit 101.

With reference to FIG. 16, a specific example of the superconducting driver circuit applied to Embodiment 5 will be described. The numeral 14 denotes a superconducting driver circuit, which has SQUIDs $6_{31}$, $6_{32}$, $6_{33}$ and $6_{34}$ stacked in four stages. The values of critical currents of superconducting junctions 1 of the SQUIDs 6 are lower from the SQUID in the lower stage toward the SQUID in the upper stage. The values of inductors $7_{31}$, $7_{32}$, $7_{33}$ and $7_{34}$ are larger from the SQUID in the lower stage to the SQUID in the upper stage. The product of the critical current by the inductor is almost ½ of a flux quantum.

Except for the SQUID $6_{31}$ in the lowermost stage, DC power source lines 3 are alternately connected to the right and left shoulders of the SQUIDs $6_{32}$, $6_{33}$ and $6_{34}$. In the SQUID in the uppermost stage, the power source line is connected to the position shifted from the center of the inductor. The applied current of each of the SQUIDs is a value corresponding to the difference between the critical currents of the superconducting junctions thereof and the SQUID in the upper stage. It is different from the superconducting driver circuit shown in FIG. 1 in that the DC bias power source line 3 is not connected to the SQUID $6_{31}$ in the lowermost stage.

Superconducting junction transmission lines 15 and 16 for input signal are connected to both sides of the SQUID $6_{31}$ in the lowermost stage of the superconducting driver circuit 14. A flux quantum signal 22 outputted from the superconducting flux quantum circuit 101 is added from the left end of the superconducting junction transmission line 15. This is inputted to the left side of the SQUID $6_{31}$ in the lowermost stage of the superconducting driver circuit 14. The superconducting junction transmission line 16 is branched from the middle portion of the superconducting junction transmission line 15 and the flux quantum signal 22 is introduced thereinto. This is inputted to the right side of the SQUID $6_{31}$ in the lowermost stage of the superconducting driver circuit 14.

As in Embodiment 1, the superconducting driver circuit 14 of Embodiment 5 is constructed by a superconducting thin film and insulator film of oxide. The superconducting junction is of the ramp edge type in which yttrium-barium-copper oxide thin films are upper and lower electrodes. A single crystal and thin film of lanthanum-strontium-aluminum-tantalum oxide are used for a substrate and an interlayer insulator film between the electrodes.

The superconducting driver circuit 14 of Embodiment 5 is operated by the following procedure. When a flux quantum is inputted from the left superconducting junction transmission line 15, the superconducting driver circuit 14 is brought to the voltage state. When a flux quantum is inputted from the right superconducting junction transmission line 16, the superconducting driver circuit is returned to the superconducting state. The flux quantum signals 22 outputted from the superconducting flux quantum circuit 101 were inputted from both sides of the squid $6_{31}$ in the lowermost stage of the superconducting driver circuit 14 as flux quantum signals whose frequencies were equal and whose phases were shifted at a fixed rate by the superconducting junction transmission lines 15 and 16. In the voltage state, an output voltage of 2.5 mV was obtained by an output line 5 of the superconducting driver circuit 14.

The operating principle of the superconducting driver circuit 14 of Embodiment 5 is as follows. In the SQUIDs $6_{31}$, $6_{32}$, $6_{33}$ and $6_{34}$ connected in series, information on a flux quantum signal is transmitted from the lowermost stage to the uppermost stage via the shared inductors 7. As a result, the SQUIDs are switched together between the zero-voltage state and the voltage state to produce a voltage obtained by adding these.

Except for the SQUID $6_{31}$ in the lowermost stage, DC bias currents are applied to the SQUIDs $6_{32}$, $6_{33}$ and $6_{34}$ in the respective stages. The respective SQUIDs are in the zero-voltage state and are held in the state close to the critical point. When the flux quantum 22 reaches from the superconducting junction transmission line 15 to the SQUID $6_{31}$ in the lowermost stage of the superconducting driver circuit 14, a loop current with the flux quantum flows to the inductor $7_{31}$. The bias current is not applied to the SQUID $6_{31}$ in the lowermost stage. The SQUID $6_{31}$ is not switched to the voltage state when the loop current with the flux quantum only flows. Until the next flux quantum reaches from the superconducting junction transmission line 16, the flux quantum of the SQUID $6_{31}$ in the lowermost stage remains. The loop current continues to flow.

The electric current added to the inductor $7_{31}$ of the SQUID $6_{31}$ in the lowermost stage also flows to the SQUID loop of the SQUID $6_{32}$ in the second stage. The bias current is applied to the SQUID $6_{32}$ in the second stage. The loop current is added so that the SQUID $6_{32}$ is switched to the voltage state. In the same manner, the loop current with the flux quantum is transmitted to the SQUID in the upper stage via the inductor shared between two SQUIDs. The SQUIDs connected in series are sequentially switched to the voltage state.

When the next flux quantum reaches from the superconducting junction transmission line 16, the flux quantum of the SQUID $6_{31}$ in the lowermost stage disappears and the superconducting current of the SQUID loop is zero. Since the loop current does not flow, the SQUID $6_{32}$ in the second stage returns from the voltage state to the zero-voltage state. In the same manner, the SQUIDs connected in series are sequentially switched to the zero-voltage.

In this superconducting driver circuit, one flux quantum is used for switch operation, and the SQUID in the lowermost stage does not switch to the voltage state. Noise with the switch of the superconducting driver circuit cannot affect the connected superconducting flux quantum circuit.

Figure 17:
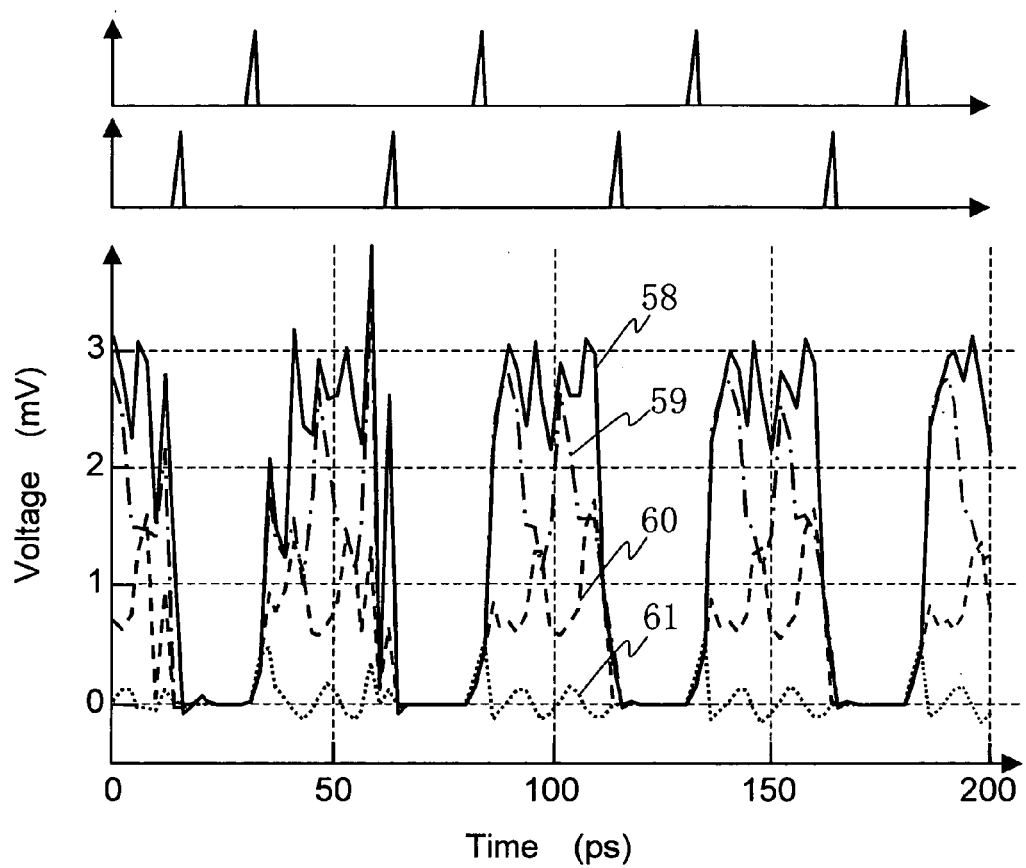
FIG. 17 is a diagram showing the high-frequency characteristic of output voltages of the superconducting driver circuit of Embodiment 5 with flux quanta inputted.

FIG. 17 shows the high-frequency characteristic of output voltages of the superconducting driver circuit 14 with flux quanta inputted. The upper stage shows flux quanta inputted via the superconducting junction transmission line 15. This brings the SQUIDs $6_{32}$, $6_{33}$ and $6_{34}$ of the superconducting driver circuit 14 to the voltage state. The middle stage shows flux quanta inputted via the superconducting junction transmission line 16. This returns the SQUIDs $6_{32}$, $6_{33}$ and $6_{34}$ of the superconducting driver circuit 14 from the voltage state to the zero-voltage state. The lower stage shows output voltages of the respective SQUIDs of the superconducting driver circuit 14. The numeral 58 denotes an output voltage of the SQUID $6_{34}$ in the upper most stage. The numeral 59 denotes an output voltage of the SQUID $6_{33}$ in the third stage. The numeral 60 denotes an output voltage of the SQUID $6_{32}$ in the second stage. The numeral 61 denotes an output voltage of the SQUID $6_{31}$ in the lowermost stage. A higher generated voltage is found to be exhibited toward the SQUID in the upper stage. An output voltage of 2.5 mV was obtained. The voltage generation time was 25 picoseconds corresponding to the reaching time difference of two flux quanta according to the delay of the branched superconducting junction transmission line 16. The superconducting driver circuit sufficiently followed an operation frequency of 20 GHz. In judgment of the steeping of the waveforms, this superconductor driver circuit permits the amplifying function to a signal having a higher frequency.

This superconducting driver circuit has two superconducting films necessary for constructing the superconducting junction and one interlayer insulator film. As in Embodiment 1, the superconducting driver circuit may be constructed by adding one superconducting thin film as a ground plane and one interlayer insulator film to flow a returning current to the ground plane. In this circuit construction, to secure the operation in the high-frequency region, no ground planes are laid other than the SQUID in the lowermost stage.

The superconducting driver circuit having the following effects can be realized.

(1) The superconducting driver circuit can be reduced in circuit area and size and can be used in a highly integrated circuit. The superconducting driver circuits can be arrayed corresponding to many output signals.

(2) The superconducting driver circuit uses a DC power source as a power source. The timings of a flux quantum signal and the driving power source need not be matched with each other so that the circuit operation is easy. Without limiting the operation frequency, the superconducting driver circuit can cope with a high-frequency region of some tens of gigahertz.

(3) The boosted SQUID portion need not be overlapped with the ground plane. Without lowering the processable operation frequency, the superconducting driver circuit can cope with a high-frequency region of some tens of gigahertz.

(4) No noise from the superconducting driver circuit to the superconducting flux quantum circuit exists. The operation margin of the superconducting flux quantum circuit cannot be reduced.

What is claimed is:

1. A superconducting driver circuit for voltage amplification comprising: a superconducting flux quantum interference device in a first stage constructing a closed loop having as components two superconducting junctions and an inductor; a superconducting flux quantum interference device in a second stage constructing a closed loop having as components two superconducting junctions and an inductor by sharing said inductor; and a superconducting flux quantum interference device in a third stage constructing a closed loop having as components two superconducting junctions and an inductor by sharing the inductor of said superconducting flux quantum interference device in said second stage, wherein the superconducting junctions of the superconducting flux quantum interference devices toward a lower stage of the superconducting junctions of the superconducting flux quantum interference devices in said respective stages have a larger critical current value, a predetermined bias current is supplied to the superconducting junctions of the superconducting flux quantum interference devices in said respective stages, and a flux quantum signal is inputted to the superconducting flux quantum interference device in the first stage to obtain an output voltage from the superconducting flux quantum interference device in the third stage.

2. The superconducting driver circuit for voltage amplification according to claim 1, wherein the superconducting flux quantum interference devices are provided in four or more stages, and an output voltage is obtained from a superconducting flux quantum interference device in the uppermost stage.

3. A superconducting driver circuit for voltage amplification comprising: superconducting flux quantum interference devices in a first stage in which a plurality of superconducting flux quantum interference devices each constructing a closed loop having as components two superconducting junctions and an inductor are arrayed in parallel so as to share an adjacent superconducting junction; superconducting flux quantum interference devices in a second stage in which a plurality of superconducting flux quantum interference devices each constructing a closed loop having as components two superconducting junctions and an inductor are arrayed in parallel in number one fewer than the superconducting flux quantum interference devices in the first stage so as to share said inductor and to share the adjacent superconducting junction; and superconducting flux quantum interference devices in a third stage in which a plurality of superconducting flux quantum interference devices each constructing a closed loop having as components two superconducting junctions and an inductor are arrayed in parallel in number one fewer than the superconducting flux quantum interference devices in the second stage so as to share the inductor of said superconducting flux quantum interference device in the second stage and to share the adjacent superconducting junction, wherein the superconducting junctions of the superconducting flux quantum interference devices in said respective stages have almost equal critical current values, a predetermined bias current is supplied to the superconducting junctions of the superconducting flux quantum interference devices in said respective stages, and a flux quantum signal is inputted to the superconducting flux quantum interference devices in the first stage to obtain an output voltage from the superconducting flux quantum interference devices in the third stage.

4. The superconducting driver circuit for voltage amplification according to claim 3, wherein the superconducting flux quantum interference devices are provided in four or more stages, and an output voltage is obtained from the superconducting flux quantum interference devices in the uppermost stage.

5. The superconducting driver circuit for voltage amplification according to claim 3, wherein the number of squids in the uppermost stage is one, and the number of superconducting flux quantum interference devices constructing the respective stages is increased by one toward a lower stage.

6. A superconducting driver circuit for voltage amplification comprising: a superconducting flux quantum interference device in a first stage constructing a closed loop having as components two superconducting junctions and an inductor; a superconducting flux quantum interference device in a second stage constructing a closed loop having as components two superconducting junctions and an inductor by sharing said inductor; and a superconducting flux quantum interference device in a third stage constructing a closed loop having as components two superconducting junctions and an inductor by sharing the inductor of said superconducting flux quantum interference device in said second stage, wherein the superconducting junctions of the superconducting flux quantum interference devices toward a lower stage of the superconducting junctions of the superconducting flux quantum interference devices in said respective stages have a larger critical current value, a predetermined bias current is supplied to the superconducting junctions of the superconducting flux quantum interference devices in said respective stages except for the superconducting junctions of the superconducting flux quantum interference device in the first stage, and a flux quantum signal is inputted to two superconducting junctions of the superconducting flux quantum interference device in the first stage to obtain an output voltage from the superconducting flux quantum interference device in the third stage.

7. The superconducting driver circuit for voltage amplification according to claim 6, wherein the superconducting flux quantum interference devices are provided in four or more stages, and an output voltage is obtained from a superconducting flux quantum interference device in the uppermost stage.

8. The superconducting driver circuit for voltage amplification according to claim 6, wherein one input signal is provided to one superconducting junction of the superconducting flux quantum interference device in the first stage, another input signal is provided to another superconducting junction, the superconducting driver circuit is switched to the voltage state by one input signal to hold a voltage state, and another input signal returns the superconducting driver circuit to a zero-voltage state.

9. A superconducting circuit comprising: a superconducting flux quantum circuit performing predetermined signal processing using a flux quantum as a signal carrier; a superconducting flux quantum-voltage converter circuit which inputs a flux quantum signal outputted from the superconducting flux quantum circuit to output, for each flux quantum signal input, a repeat state of a state that a flux quantum train exists and a state that a flux quantum train does not exist; and a superconducting driver circuit for voltage amplification receiving as an input the output of the superconducting flux quantum-voltage converter circuit.

10. The superconducting circuit according to claim 9, wherein a circuit which multiplies a flux quantum inputted as the output of said superconducting flux quantum-voltage converter circuit to be dividedly flowed to two circuits for being inputted to one output circuit is inserted between the superconducting flux quantum-voltage converter circuit and the superconducting driver circuit for voltage amplification.

* * * * *